US006237121B1

(12) United States Patent
Yadavalli et al.

(10) Patent No.: US 6,237,121 B1
(45) Date of Patent: May 22, 2001

(54) METHOD AND APPARATUS FOR PERFORMING REGISTER TRANSFER LEVEL SCAN SELECTION

(75) Inventors: Sitaram Yadavalli; Sanjay Sengupta, both of San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/096,718

(22) Filed: Jun. 12, 1998

(51) Int. Cl.$^7$ ................................................. G01R 31/28

(52) U.S. Cl. ............................................................... 714/726

(58) Field of Search .................................... 714/726, 727, 714/724, 729, 730

(56) References Cited

U.S. PATENT DOCUMENTS

| | | | |
|---|---|---|---|
| 5,043,986 | 8/1991 | Agrawal et al. | 371/25.1 |
| 5,513,118 | * 4/1996 | Dey et al. | 364/490 |
| 5,513,123 | * 4/1996 | Dey et al. | 364/489 |
| 5,875,196 | * 2/1999 | Chakradhar et al. | 371/22.1 |
| 5,903,475 | * 5/1999 | Gupte et al. | 364/578 |
| 6,067,650 | * 5/2000 | Beausang et al. | 714/726 |

OTHER PUBLICATIONS

Yadavalli, Pomeranz, Reddy, "MUSTC–Testing: Multi–Stage–Combinational Test scheduling at the Register–Transfer Level", Proceedings of the 1995 8th International Conference on VLSI Design, Jan. 4–7, 1995, pp. 110–115.*

Motohara, Takeoka, Hosokawa, Ohta, Takai, Matsumoto, Muraoka, "Design for testability using register–transfer level partial scan selection", Proceedings of the 1995 Asian and South Pacific Design Automation Conference (ASP-DAC'95/CHDL'95/VLSI'95), Aug. 29–Sep. 1, 1995, pp. 209–215.*

Chiu, Papachristou, Fu, "A scan path selection method for RTL and mixed level circuits", 1996 IEEE International Symposium on Circuits and Systems (ISCAS '96), May 12–15, 1996, pp. 600–603.*

Bhattacharya, Dey, Sengupta, "An RTL methodology to enable low overhead combinational testing", Proceedings of the 1997 European Design and Test Conference (ED&TC 97), Mar. 17–20, 1997, pp. 146–152.*

Yadavalli, Sengupta, "Impact and cost of modeling memories for ATPG for partial scan designs", Proceedings of 1998 11th International Conference of VLSI Design, Jan. 4–7, 1998, pp. 274–278.*

Greene, Mourad, El–Ziq, "Partial scan: hardware and fault coverage trade–off", Proceedings of 1998 IEEE Instrumentation and Measurement Technology Conference (IMTC/98), May 18–21, 1998, pp. 423–427.*

(List continued on next page.)

*Primary Examiner*—Albert Decady
*Assistant Examiner*—Samuel Lin
(74) *Attorney, Agent, or Firm*—Blakely, Sokoloff, Taylor & Zafman LLP

(57) ABSTRACT

A technique for a scan design employing a register transfer level scan selection which requires that either all bits of a register are designated to have all scan or all non-scan properties. No separate elements (bits) of a register are selected for individual scan. By designating scan selection at the register level, register-transfer-level (RTL) specifications of a digital circuit can employ signal flow vectors at the register level and not at the conventional logic gate level. In one technique, a number of registers are grouped to have the same scan or non-scan property. Such grouping is used to provide a common template for inserting scan into multiple instantiated modules. The group designation for selecting scan or non-scan registers is also used to scan registers at the memory input, output, both input and output, or neither, which then can be used for testing memory devices.

20 Claims, 7 Drawing Sheets

OTHER PUBLICATIONS

Toshiharu Asaka. Subhrajit Bhattacharya, Sujit Dey and Masaaki Yoshida, H–Scan +: A Partical Low–Overhead RTL Design–for–Testability Technique for Industrial Designs, IEEE, 0–7803–4209–7/97, 1997, pp. 265–274.

Erwin Trischler, Incomplete Scan Path With An Automatic Test Generation Methodology, 1980 IEEE Test Conference, CH1608–9/90/0000–0153 pp. 153–162.

D.H. Lee and S.M. Reddy, On Determining Scan Flip–Flops in Partial–Scan Designs, IEEE, CH2924–9/90/0000/0322, 1990 IEEE, pp. 322–325.

Dong Ho Lee and Sudhakar M. Reddy, A New Test Generation Method for Sequential Circuits, IEEE, CH3026–2/91/0000/0446 1991 IEEE, pp. 446–449.

James Beausang, Chris Ellingham and Markus Robinson, IEEE 07803–3540–6/96 1996 IEEE, pp. 751–756.

Arun Balakrishnan and Srimatt T. Chakradhar, Peripheral Partitioning and Tree Decomposition for Partial Scan, IEEE, 1063–9667/97 1997 IEEE, pp. 181–186.

* cited by examiner

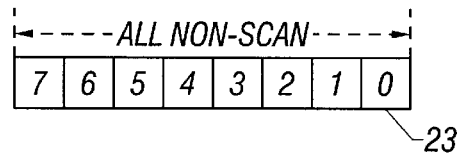
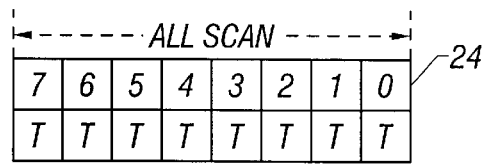
FIG. 4A   FIG. 4B
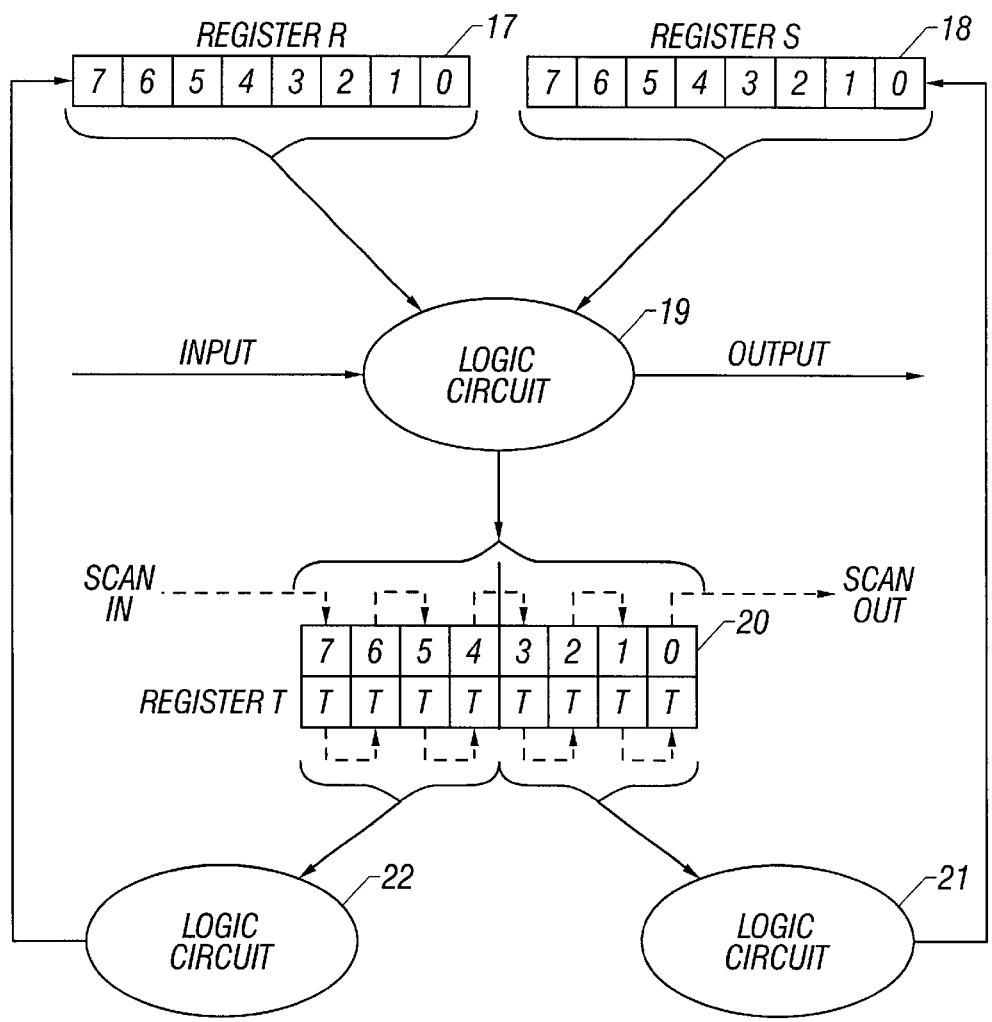
FIG. 5

METHOD AND APPARATUS FOR PERFORMING REGISTER TRANSFER LEVEL SCAN SELECTION

BACKGROUND OF THE INVENTION

1. Field of the Invention

The present invention relates to the field of integrated circuit testing and, more particularly, to a technique for performing register-transfer-level scan selection.

2. Background of the Related Art

It is generally known in the semiconductor industry that the testing of integrated circuits comprising thousands or millions of transistors requires complex techniques and specialized test equipment. For example, in a typical processor chip, such as the processors manufactured by Intel Corporation, a variety of different devices are fabricated on a chip. Execution units (both integer and floating point), regular memory, cache memory, register files, decoders, buffers, buses, as well as other circuitry are resident on chip. Thus, the complexity of testing such devices has magnified as more transistors and functions are placed on the chip.

One common method for testing integrated circuits is the use of scan design techniques. In a typical scan technique, specialized circuits are designed into the chip and activated when a test mode is enabled. The activation of the test mode permits a variety of test inputs to be made through the specially designed test circuitry. Then, the integrated circuit is operated under normal mode for one or more clock cycles. Subsequently, the test mode is enabled again and some of the contents of registers and sequential elements internal to the integrated circuit (or portion thereof) are scanned out of the circuit, which is then monitored to determine if the correct results are noted.

A full scan selection technique will test most of the nodes in the circuit to determine the validity of the device, since all sequential elements are made controllable and observable using the scan design. However, full scan selection requires considerable chip space to include the scan design-for-test circuitry required for the scan. In lieu of full scan, partial scan selection techniques have been devised to scan only some of the sequential elements in the circuit. For example, U.S. Pat. No. 5,043,986 describes a method for partial scan testability.

When partial scan selection is utilized for testing, the manner in which circuits are to be scanned can determine the performance of the test technique and the quality of the test generated. For example, the U.S. Pat. No. 5,043,986 patent teaches the elimination of cycles (feedback paths) of desired length to select only a small fraction of the total memory elements of a circuit. Other methodologies develop on partial scan selection to identify which circuits are to be included in the scan path. See for example, "Incomplete Scan Path With An Automatic Test Generation Methodology" by Erwin Trischler, IEEE Test Conference, pp. 153–162, 1980; "On Determining Scan Flip-Flops in Partial-Scan Designs" by D. H. Lee et al., IEEE, pp. 322–325, 1990; "A New Test Generation Method for Sequential Circuits" by D. H. Lee et al., IEEE, pp. 446–449, 1991; "Integrating Scan Into Hierarchical Synthesis Methodologies" by J. Beausang et al.; International Test Conference, IEEE, pp. 751–756, 1996; "Peripheral Partitioning and Tree Decomposition for Partial Scan" by A. Balakrishnan et al., IEEE, pp. 181–186, 1997; and "H-Scan+: A Practical Low-Overhead RTL Design-for-Testability Technique for Industrial Designs" by Toshiharu Asaka et al., International Test Conference, IEEE, pp. 265–274, 1997.

Although a variety of methodologies exist for partial scan of integrated circuits for testing purposes, the prior art design techniques operate at the circuit level. That is, design criteria for the selection of the sequential circuit components which are to be modified for scanning are performed at the logic gate level. For example, the U.S. Pat. No. 5,043,986 patent provides a method of partial scan design for chip testing, in which the selection of scan memory elements eliminates cycles in the circuit while the circuit is in a test mode. By eliminating cycles of desired lengths, the set of scan memory elements may be only a small fraction of the total memory elements of a circuit. Accordingly, the scan selection looks to the scanning of certain selected circuit components at the logic gate level. The gate level circuit is one that consists of various types of logic gate level elements (such as AND, OR, NAND, etc., inverters, latches and flip-flops).

Although the partial scan selection of circuit components at the logic gate level can provide for optimized presence and usage of test circuitry on integrated circuit chips, it can become very cumbersome to implement in very dense chips, such as a processor chip. Due to a very large number of elements present in a logic gate level netlist, conventional gate level tools take a significant amount of time to select a scan configuration. Register-transfer-level (RTL), on the other hand, is a design specification which is a hierarchy above the circuit level and is utilized extensively for the design of processor chips. It would be advantageous to adapt a scan selection design technique for use at the RTL.

A disadvantage of using the previously known logic gate level partial scan selection techniques is illustrated in FIGS. 1–3. In FIG. 1, a number of gate level sequential circuit elements 10a–c and 11a–c associated with a particular logic circuit 12 (such as a combinational logic) are shown. Sequential circuit elements 10a–10c provide the inputs to the logic circuit block 12. The circuit elements 11a–c are coupled to receive as inputs a set of output from the logic block 12. After capturing them, the elements 11a–c generate outputs that are fed as inputs to another logic circuit 13. The outputs of the elements 11a–c will depend on the values transferred from the elements 10a–c and input signal(s) to the logic block 12. The outputs of the logic circuit block 13 are then coupled back to the elements 10a–10c to change the values (or status) of these elements. Thus, in normal operation, the input signals are processed by the logic block 12, along with the signal values from elements 10a–10c, to generate output signal(s) from the logic block 12, as well as the signal changes that are captured by the sequential elements 11a–c. A similar sequence of events occurs with the elements 11a–c and logic block 13 to generate signals back to elements 10a–c.

When current methodologies for partial scan selection are used, some of the gate level elements are selected. In the illustration, elements 11a, 11c and 10b are scanned, typically in a sequential fashion. This is shown by the dotted line coupling the three shaded elements. The shading indicates the elements selected for scanning, which elements (or cells) 11a, 11c and 10b will include test circuitry necessary to execute the scan (or test) a variety of such test circuitry are known in the art for performing the scan, including the test circuits described in the earlier-mentioned U.S. Pat. No. 5,043,986 patent. In the test mode, a scan signal (SCAN IN) is coupled to the three selected elements 11a, 11c and 10b and the output (SCAN OUT) of the last sequential cell is used to read the test results This is done by first loading the sequential cells 11a, 11c and 10b in a serial fashion like a shift register whose input is (SCAN IN). This forms the basis of the scan. The clock is pulsed through a certain number of cycles. The resulting values captured in the scan sequential elements 11a, 11c and 10b are then shifted out in a serial fashion and observed at the output (SCAN OUT). This is the general technique of operating scan at the logic gate level. Again a variety of techniques are known for making the selection of a portion of the flip-flops, latches and logic gates present on the chip.

A disadvantage of this approach is shown in FIG. 2. In FIG. 2, the various gate level logic elements are shown formed into a register. A register format is any configuration of bits or data which are manipulated together at a higher level of abstraction. For example, bits forming an instruction word or a set of bits which represent a number are often manipulated as a single, unified higher level entity. The set of sequential elements defined by the same name in a high level description are referred to as registers. Registers are typically multi-bit (although registers can exist as single bit registers), and the content of the register is operated on in a single operation, such as the execution of an instruction. For example, in an adder, contents of one register are added to the contents of another register and the result is placed in one of the two original registers or a third register. The concept and the use of registers and register files are known in the art.

FIG. 2 illustrate the use of two registers 17 and 18 (shown as 8-bit registers), wherein the contents of the registers 17, 18 are processed by a logic circuit 19. It is appreciated that each of the bits of the registers are stored in a gate level sequential component, often known as latches or flip-flops. Thus, when "bits" are discussed below, it is understood that the bits represent some individual circuit component whose state represents the value of the bit. Accordingly, when a prior art gate-level partial scan selection methodology is utilized on a set of bits configured into a register, only some of the bits of the register may get selected for scan. Thus, in the example, bits that are scanned are shown in large blocks to designate the presence of a test circuitry 15 (also shown as "T"), which is utilized in the scan mode. In the illustration, bits 2, 3 and 7 are the scanned bits in the register 17 (also referred to as REG R) and bits 1, 3 and 6 are the scanned bits in the register 18 (also referred to as REG S), while other bits in these registers 17,18 are non-scan bits.

In the illustration, the bits of REG R and REG S are coupled to a logic circuit 19 and subsequently one set of outputs from the logic block 19 are coupled to a register 20 (also referred to as REG T). Next, the lower bits 3:0 of REG T are coupled to a logic circuit 21 and the upper bits 4:7 are coupled to a logic circuit 22. A set of outputs from the logic circuit blocks 22 and 21 are also coupled back to the registers REG R and REG S, respectively. The particular configuration is shown as an example to illustrate the selection of individual elements of a register when prior art scan selection techniques are utilized in the scan design.

As noted in FIG. 2, some of the bits within a register are designated as scanned bits, while others are not. This results from the use of existing gate-level scan methodologies that are employed for partial scan selection. The resulting configuration requires for each individual bit to be separately assigned a scan property. A problem with this approach is that higher level design and test methodologies cannot be effectively implemented using these design-for-test specifications. That is, a state signal representing a register (such as REG T) cannot be described in the RTL as a single signal vector.

In FIG. 2, the bits are shown arranged into registers. Accordingly, a scan signal flow analysis graph (S-Graph) for implementing the scan selection methodology using one of the prior art scan selection techniques may result in the graph shown in FIG. 3. In FIG. 3, bit [7] of REG R is shown connected to bits [7:0] of REG T, to indicate that the value of this bit scan impacts the value of any of the bits in REG T. Likewise, bit [7] of REG T. is shown connected to all bits [7:0] of REG R to indicate its effect in the feedback to all of the bits in REG R. It is appreciated that connections of the other bits are not shown, but it is understood that similar connections are utilized based on the diagram of FIG. 2. Thus, each bit of REG. R and REG S would connect to each bit of REG T in the signal flow graph. Also, bits [7:4] of REG T will connect to all bits of REG R, while bits [3:0] will connect to all bits of REG S.

Accordingly, as noted in the S-Graph diagram of FIG. 3, the scan selection technique employed at the logic gate level results in a complex and cumbersome analysis, since the design mandates the scan selection and signal flow vectors at the individual bit level. When employing the prior art design for scan selection, the device specification contains hardware description-language constructs that have a one-to-one correspondence with the physical latch or flip-flop representations in the circuit. It is appreciated that a significant advantage would result from a design technique which would take into account the scan selection based on a higher level of the hierarchy than at the gate level.

SUMMARY OF THE INVENTION

The present invention describes a technique for a scan design employing a register transfer level scan selection and performing partial scan selection of an integrated circuit based on the register transfer level scan selection. A methodology is set forth which requires that either all bits of a register or sequential elements configured as a register are designated to have scan or non-scan properties. Thus, no separate elements (bits) of a register are selected for individual scan. By designating scan selection at the register level, register-transfer-level (RTL) specifications of a digital circuit can employ signal flow vectors at the register level and not at the conventional logic gate level.

A number of applications of using the design technique of the present invention for scan selection are noted. In one technique, a common template is used to group registers to have either a scan or non-scan property for each group. The grouping of registers for scan selection allows for a common template when multiple instantiated modules are used in an integrated circuit device where scan insertion is desired. The group designation for selecting scan or non-scan registers can also be used for grouping signals that have some commonality. Furthermore, since memories operate to provide inputs and outputs, the scan selection based on the present invention can be used to scan registers at the memory input, output, both input and output, or neither, which then can be used for testing memory devices.

BRIEF DESCRIPTION OF THE DRAWINGS

FIG. 4A shows a non-scan configuration for designating sequential elements associated with a register, when designing with the scan design technique of the present invention.

FIG. 4B shows a scan configuration for designating sequential elements associated with a register, when designing with the scan design technique of the present invention.

FIG. 5 shows the implementation of the register level scan selection technique of the present invention as applied to similar arrangement of sequential elements forming registers shown in FIG. 2.

DETAILED DESCRIPTION OF THE INVENTION

A technique for providing partial scan selection at a register transfer level (RTL) is described. In the following description, numerous specific details are set forth, such as specific structures, registers, memories, bit patterns, block diagrams, and example operations, etc., in order to provide a thorough understanding of the present invention. However, it will be appreciated by one skilled in the art that the present invention may be practiced without these specific details. In other instances, well known techniques and structures have not been described in detail in order not to obscure the present invention.

Referring to FIGS. 4A–B, configurations for establishing a scan property for a particular set of circuit elements which represent an arrangement of bit(s) of a register are illustrated. In the technique of the present invention, sequential elements are not individually targeted on a per bit basis. Instead, the registers they belong to are considered the basic indivisible entities that must be assigned scan or non-scan properties. Thus, the scan selection requirement of the present invention requires that all bits of a register be selected for a scan or not scanned at all.

In FIG. 4A, register 23 is shown having all bits in the register selected to have a non-scan property (also referred to as non-scanned bits or non-scanned register), while in FIG. 4B, all of the bits of a register 24 have scan properties (also referred to as scanned bits or scanned register) and, therefore, includes a test circuitry "T" for use during the scan. Again, as noted above, the implementation of such scan test circuitry is known in the art. Accordingly, the scan selection technique of the invention prohibits individual bits of a register to be selected for scanning. Integrated circuit devices implementing the present invention will have its registers designated to have properties as either scan registers 24 or as non-scan registers 23.

Figure 1:
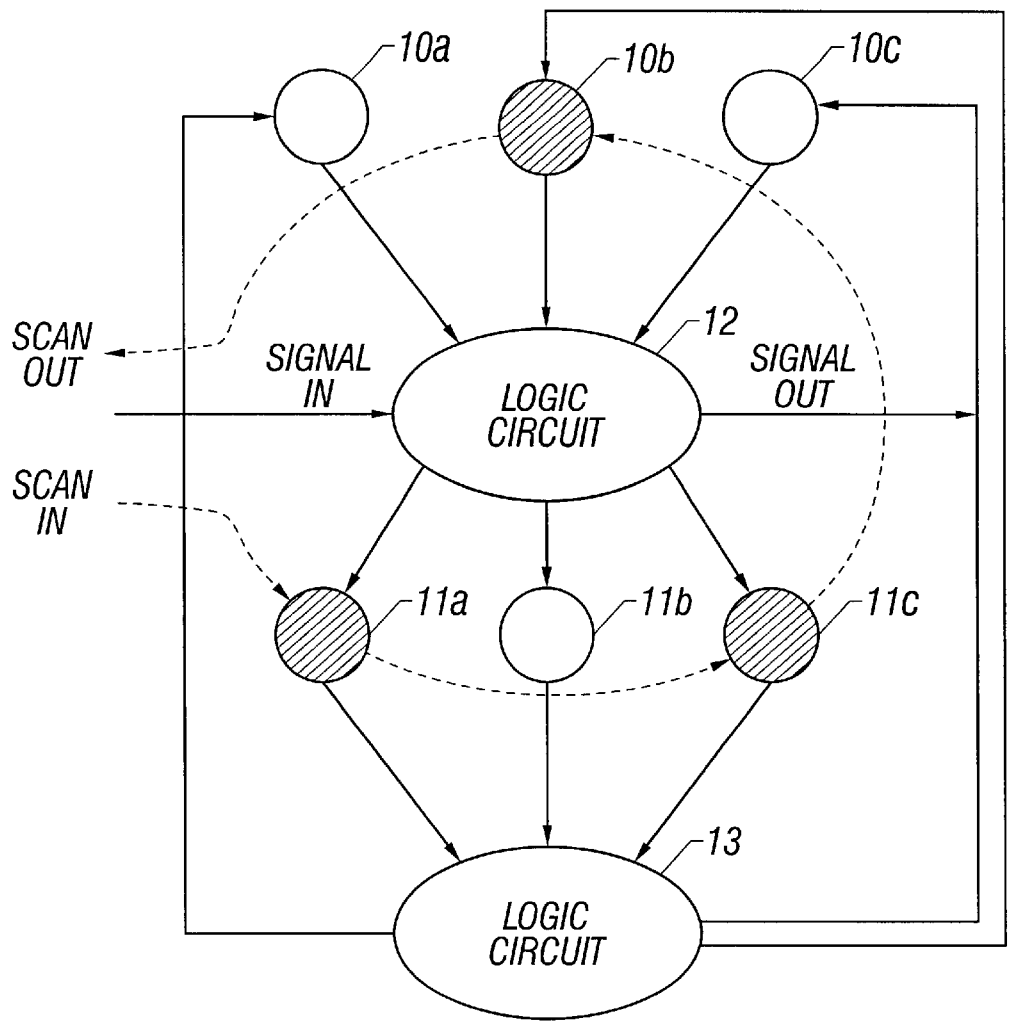
FIG. 1 shows a technique of utilizing a prior art partial scan selection technique to select individual sequential logic gate level components for scan selection in an integrated circuit chip.
Figure 2:
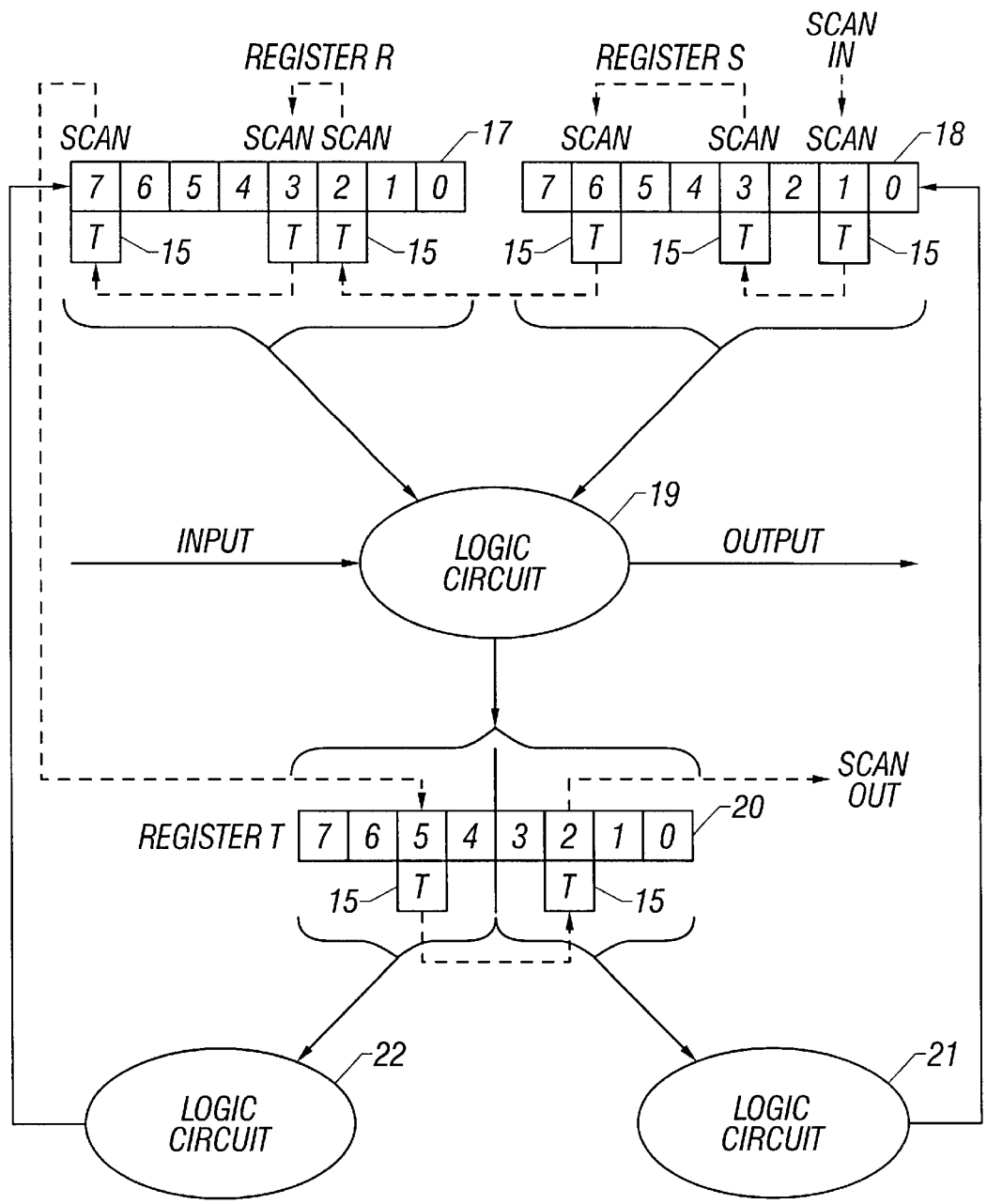
FIG. 2 shows the implementation of the prior art logic gate level scan selection technique of FIG. 1 as applied to sequential elements forming registers and the resulting mix of register elements (bits) having scan and non-scan properties.
Figure 3:
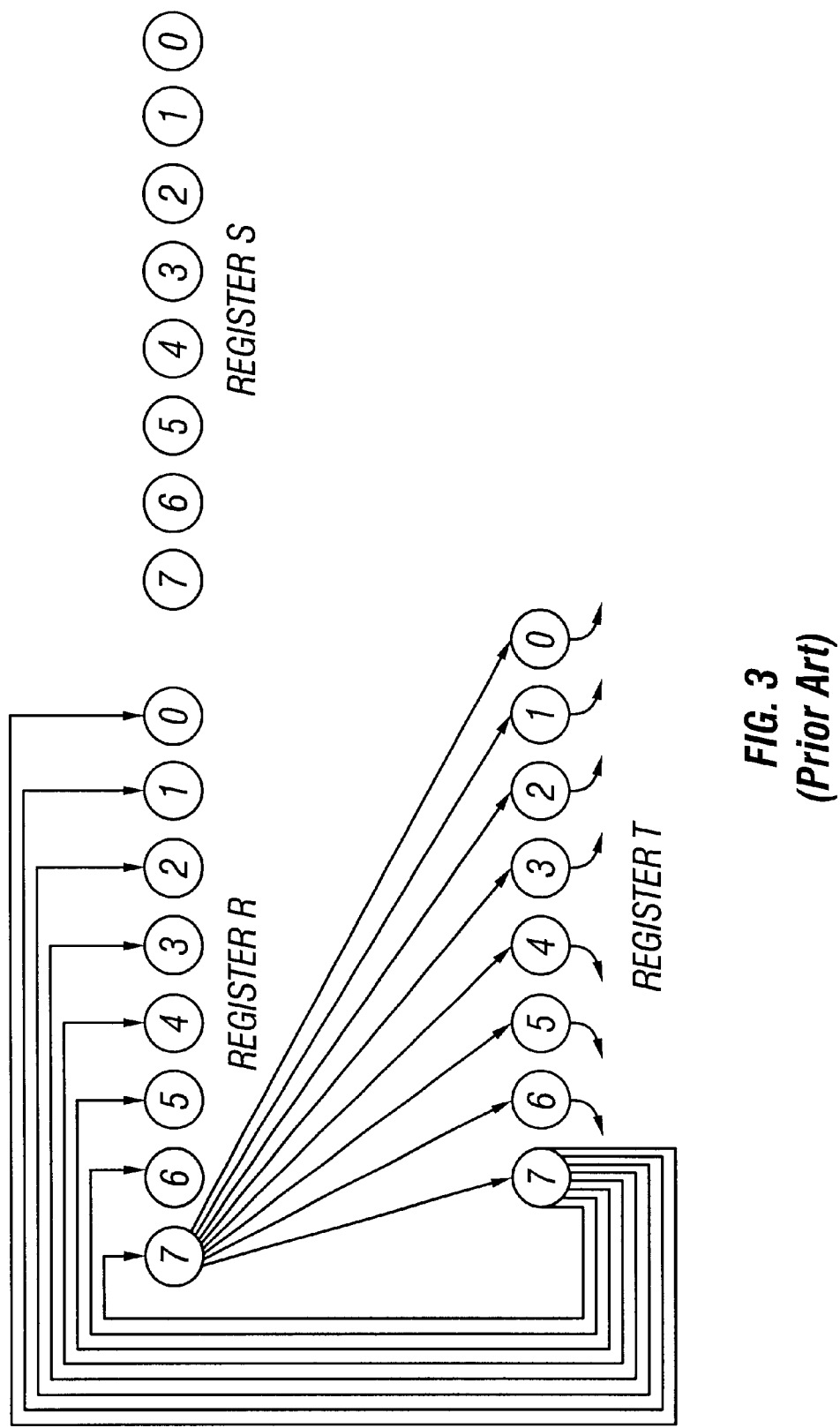
FIG. 3 is an example of a signal flow graph of the register elements when prior art scan selection techniques are employed for scan design.

FIG. 5 shows an example implementation of the invention when applied to the registers and logic circuitry described above in FIG. 2. In the present instance, REG R and REG S are now shown having non-scan properties, but REG T is shown having scan properties. In normal operation of the integrated circuit, the registers 17, 18, 20 and logic blocks 19, 21, 22 perform the same operations as before. However, when in the test mode, only those registers having scan properties are selected for scanning. An example scan path is denoted by the dotted line in FIG. 5, in which only the bits in REG T can be selected for scan. Thus, no individual bit in a register is targeted for scanning. If a bit in a register is to be targeted for scanning, the register as a whole must be designated to have the scan property.

Figure 6:
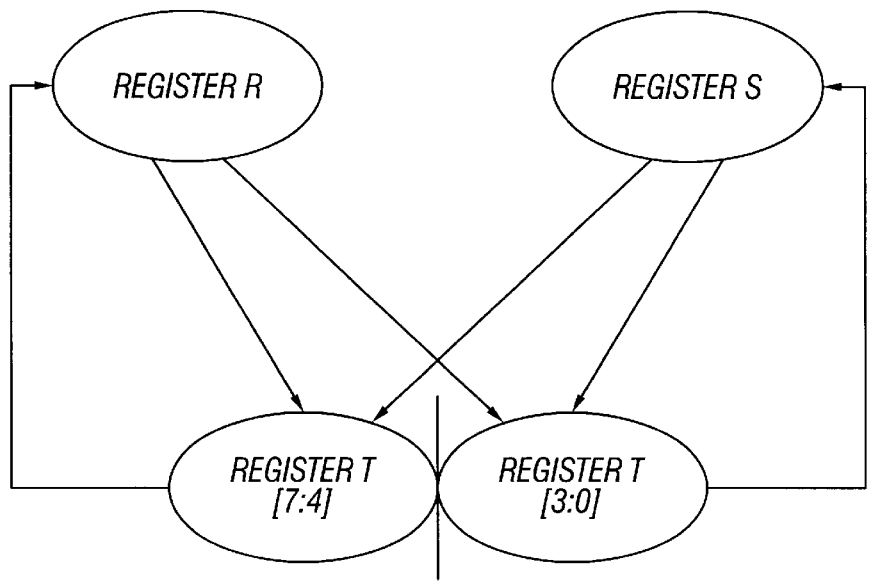
FIG. 6 is an example of a signal flow graph of the register elements when the scan selection technique of the present invention is employed for scan design.

One advantage of the use of the present invention is illustrated in FIG. 6. FIG. 6 shows an S-Graph which utilizes the present invention to enable a partial scan-selection based on the RTL specification. Since the basic individual entity is now at the register level, signal flow vectors can also be construed to operate at the register level. Accordingly, only two signal flows are noted emanating form REG R to REG T, instead of the sixty-four signal paths needed in FIG. 2 for REG R. One path is to bits [7:4] and the other is to bits [3:0] of REG T. Correspondingly, REG S also only has two signal paths to REG T. From REG T, one signal path is required for feedback to REG R and a second to REG S.

The scan design based on registers allows RTL description-language constructs to readily select registers as the basic entities for scan or non-scan. By assigning this register quality to state signals of an integrated circuit device, all state signals (signals which are outputs of sequential elements) and/or sequential elements that comprise a register are gathered together and assigned "register" property. This then ensures that either all sequential elements forming that register are scanned or none are scanned. Since the registers will take one of two configurations (scan or non-scan properties), the registers will have identical characteristics and layout for scan insertion. This simplicity will allow for significant savings in productivity and in layout area design. The invention will also allow for substantial reduction in the time it takes to perform scan selection, because the number of vector elements (such as registers and busses at the RTL) are far fewer than the elements in a gate-level representation. Accordingly, by the practice of the present invention, partial scan selection performance for testing integrated circuit devices is improved.

The application of the invention at a higher level of the hierarchy than at the logic gate level permits other improvements to be practiced in regards to scan design for testing. Further advantages in the implementation of the invention are illustrated in the following FIGS.

Figure 7:
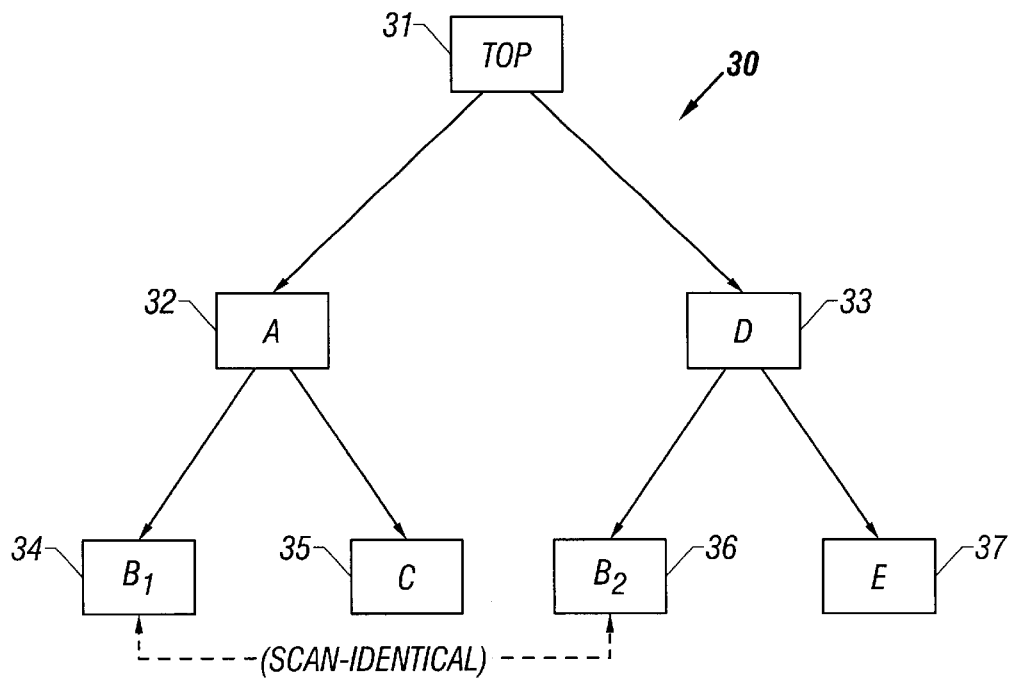
FIG. 7 shows an application of the scan design technique of the present invention as applied to multiple instantiated modules.

Referring to FIG. 7, a hierarchical arrangement of functional blocks (FUBs) or modules that are typically used as design blocks of integrated circuits chips is shown. Each FUB or module represents a particular arrangement of circuit components (or instances) which perform a function. The particular arrangement 30 shows a module 31 (also labeled as module TOP) as the highest level module in the particular hierarchy. At the next level are modules 32 and 33 (module A and module D, respectively). A level lower from module A are modules 34 and 35 (modules B1 and C) and a level lower from module D are modules 36 and 37 (modules B2 and E).

It is presumed that the modules with the same letter have the same functional design and are referred to as instantiated modules (perform the same function). Thus, modules B1 and B2 are identical in the normal operating function that they perform. For example, modules B1 and B2 may be an adder circuit. Even though the normal operating circuitry is identical, when prior art scan design techniques are employed to select the various gate-level devices for testing, invariably the scan patterns selected are different between modules 34 and 36. Thus, although the normal functional circuitry would be identical, the scan-for-test circuitry may be different between modules B1 and B2. When incorporating the various scan-for-test circuitry to the two instantiated modules B1 and B2, the design layout pattern and RTL description becomes different with the prior art design technique.

Figure 8:
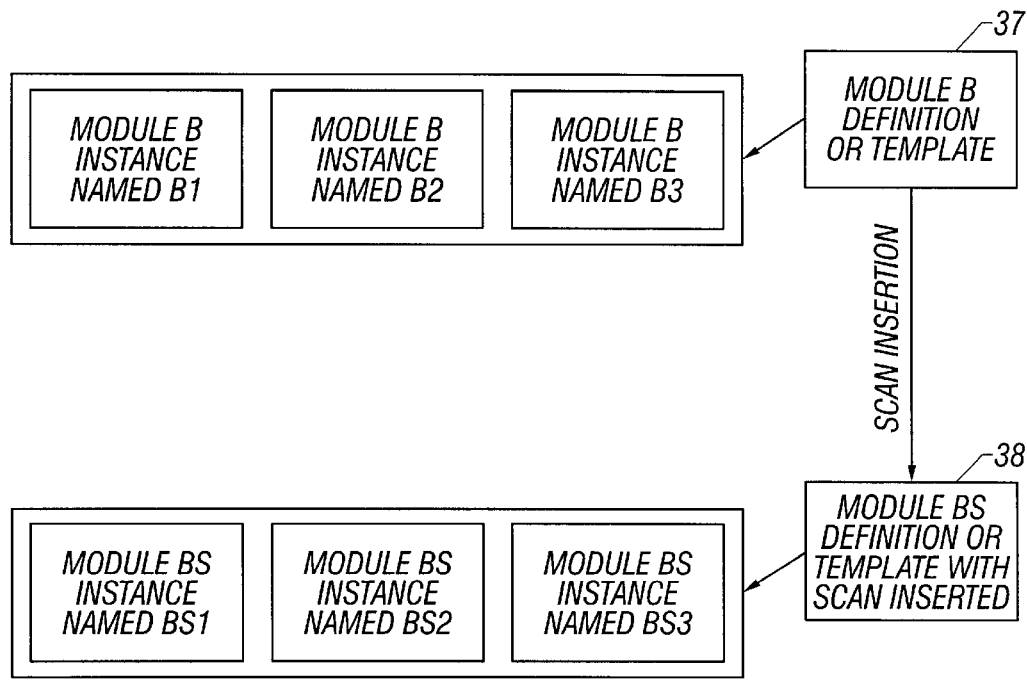
FIG. 8 shows an implementation of the scan design technique of the present invention to use a common template for scan insertion of instantiated modules.

However, with the practice of the present invention, the higher level design technique can specify that the same registers in the identical modules be selected to have the same scan properties. Accordingly, the modules B1 and B2 are designed identically, even with the inclusion of the scan-for-test circuitry. This is illustrated in FIG. 8. In FIG. 8, a module B definition or template 37 identifies a particular module, which may have multiple instances (shown as B1, B2 and B3 in the FIG.). When scan insertion is desired for the module, module 37 is modified to a scan module 38 (module BS). A single template 38 is now utilized for the multiple instances, which are now identified as BS1, BS2 and BS3.

The multiple instantiated modules in a design will have identical scan configuration, so that only one template is required for scan insertion for a particular module design. The single scan insertion template for the like instantiated modules is achieved by grouping all instances of a sequential signal defined in the non-scan module template into a group (GRP), based on the hierarchy information. This is shown in FIG. 9.

Figure 9:
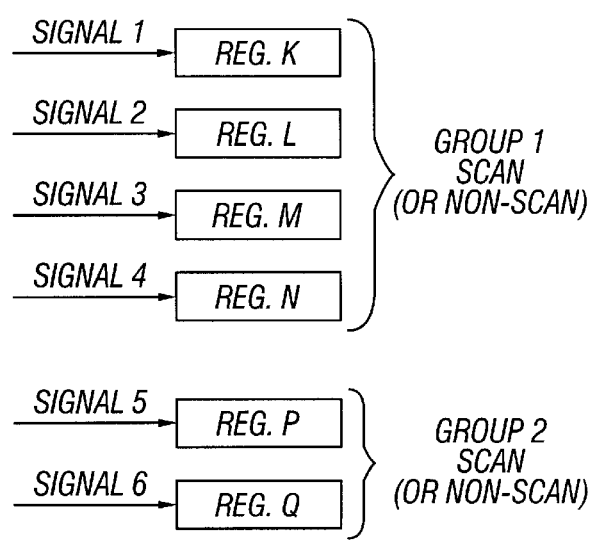
FIG. 9 shows an implementation of the scan design technique of the present invention to use a grouping of registers for designation of scan or non-scan properties.

Referring to FIG. 9, four registers REG K, REG L, REG M and REG N are shown grouped together as a register group GRP 1. The register group GRP 1, as a group, can have either scan or non-scan properties associated with it. A second register group GRP 2, comprised of registers REG P and REG Q, is also shown. GRP 2 can also have either scan or non-scan properties. In the group example, all of the registers within a designated group will have scan or non-scan properties. Thus, the present invention can also be extended from the designation of a single register to have certain scan properties, but to a grouping of registers.

The grouping of registers for designating like scan properties need not be limited to its use in instantiated modules. For example, it may be desirable to group sequential elements which operate on similar type of signals. A specific collection of signals can be designated into a group in order to assign identical scan properties to all signals in any such collection or group. For example, this grouping technique can be used to group all the signals which derive their names using an iterative logic module. Another example is the grouping of signals that fall into a group which can be described using a regular expression or generic strings containing characters from the ASCII or keyboard character set. There are a variety of other grouping schemes. In all of these schemes, the operative intent is to group sequential elements or registers which have some functional or designation commonality.

Additionally, since memories can be treated similar to registers because of similar functionality, the scan design technique can be applied to inputs and outputs of memory devices. That is, a typical scan-selection procedure introduces the useropted scan-inclusion around each memory. Accordingly, scan-inclusion configurations around or in the vicinity of a given memory device are provided by the tool utilized for scan selection. The scan-inclusion configuration can be adapted for use in practicing the present invention as applied to memory devices. An example of such a procedure, with a memory (or register) array having two input and two output sides, is illustrated in FIGS. 10A–D.

Figure 10A:
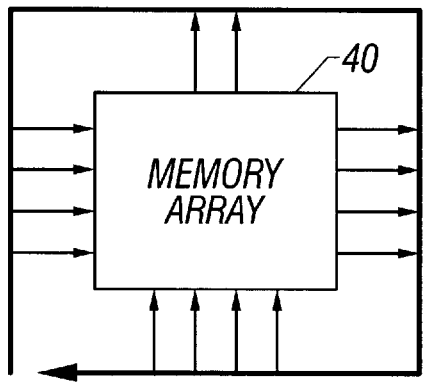
FIG. 10A show an application of the present invention in which a memory array is configured to have both its input and outputs scanned.
Figure 10B:
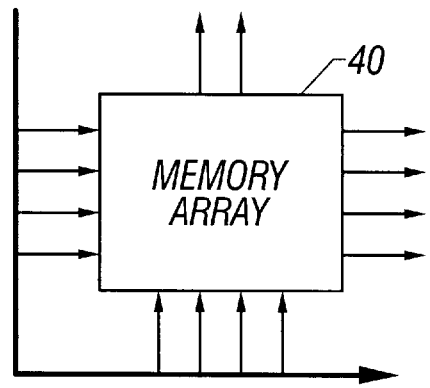
FIG. 10B show another application of the present invention as pertained to the memory of FIG. 10A, but in which the memory array is configured to have only its input scanned.
Figure 10C:
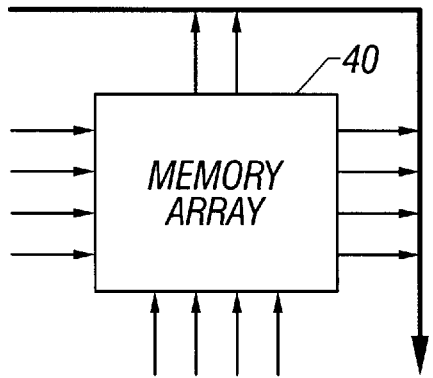
FIG. 10C show another application of the present invention as pertained to the memory of FIG. 10A, but in which the memory array is configured to have only its output scanned.
Figure 10D:
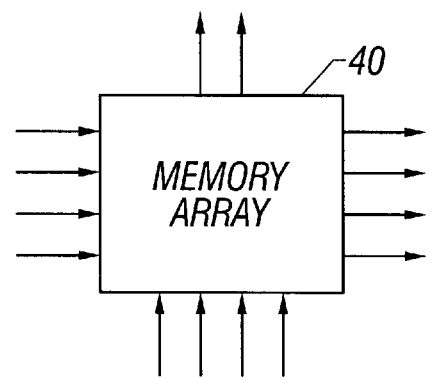
FIG. 10D show another application of the present invention as pertained to the memory of FIG. 10A, but in which the memory array is configured to have neither its input or output scanned.

Referring to FIGS. 10A–D, four different scan design approaches to scanning memory arrays is shown. In FIG. 10A, all registers that feed the input of a memory array (or register array) 40 and those registers that are fed by the output of the array 40 are scanned. In FIG. 10B, only the registers that feed the input signals are scanned. In FIG. 10C, only the registers that are fed by the output are scanned. FIG. 10D shows the case when the array 40 is not scanned at all. That is, those registers that feed the input signals and registers that are fed by the output have non-scan properties.

It is appreciated that other examples can be implemented to practice the invention. Such implementations are within the spirit and scope of the present invention. It is also understood by those skilled in the art, that a variety of test circuitry can be included with the scan-selected register elements to perform the actual scanning during the test mode.

A number of advantages are obtained with the practice of the present invention. Many have been noted above in the description. From an architectural viewpoint, the RTL hierarchy level of scan design and selection significantly improves the time required to perform scan selection as well as the time required for circuit layout. Thus, device layout efficiency is obtained as well as speed improvement over conventional gate level scan selection methods. The large capacity noted in the netlist of complex integrated circuit devices (such as processors) can be simplified significantly by the higher hierarchy implementation of the invention. Further, the selection process of the design can be automated by implementing the invention in an algorithm and inserted into the register-transfer-level specification with minimal impact to the design development process.

Thus, a technique for providing partial scan selection at a register transfer level (RTL) is described.

We claim:

1. A method comprising:

identifying sequential elements that form a register or signals which are outputs of sequential elements that form a register, the sequential elements or signals of sequential elements being associated with bits of the register;

selecting if the register is to have a scan property or a non-scan property;

designating the complete register for scan selection if the register is selected to have the scan property, so that bits of the register are not individually selected for scan;

excluding each sequential element or signal of a sequential element from scan selection if the register is selected to have the non-scan property; and providing scan-for-test circuitry to the elements of the register if the register is designated for scan selection.

2. The method of claim 1 further comprising selecting multiple registers and grouping the registers to have the same scan or non-scan property as a group.

3. The method of claim 1 further comprising identifying like registers in identical instantiated modules and selecting the like registers of the identical instantiated modules to have the same scan or non-scan property.

4. The method of claim 1 further comprising identifying registers which couple information to memory or from memory and selecting either those registers which couple information to memory or those registers which couple information from memory to have the same scan or non-scan property.

5. The method of claim 1 further comprising identifying registers which couple information to memory or from memory and selecting both those registers which couple information to memory and those registers which couple information from memory to have the same scan or non-scan property.

6. A method of designing a partial scan selection technique at a register-transfer-level (RTL) for identifying elements of an integrated circuit which are to be selected for a scan, the RTL having a specification based on signal flow vectors at a register level and not at a logic gate level and in which the scan selection technique is also based on the RTL signal flow vector, comprising:

identifying sequential elements that form a register or signals which are outputs of sequential elements that form a register, the sequential elements or signals of sequential elements being associated with bits of the register;

selecting if the register is to have a scan property or a non-scan property;

designating the complete register for scan selection if the register is selected to have the scan property, so that bits of the register are not individually selected for scan;

excluding each sequential element or signal of a sequential element from scan selection if the register is selected to have the non-scan property; and providing scan-for-test circuitry to the elements of the register if the register is designated for scan selection.

7. The method of claim 6 further comprising selecting multiple registers and grouping the registers to have the same scan or non-scan property as a group.

8. The method of claim 6 further comprising identifying like registers in identical instantiated modules and selecting the like registers of the identical instantiated modules to have the same scan or non-scan property.

9. The method of claim 6 further comprising identifying registers which couple information to memory or from memory and selecting either those registers which couple information to memory or those registers which couple information from memory to have the same scan or non-scan property.

10. The method of claim 6 further comprising identifying registers which couple information to memory or from memory and selecting both those registers which couple information to memory and those registers which couple information from memory to have the same scan or non-scan property.

11. A method of testing an integrated circuit in which the placement of design-for-test circuitry of the integrated circuit is determined by designing a partial scan selection technique at a register-transfer-level (RTL) for identifying elements of an integrated circuit which are to be selected for a scan, the RTL having a specification based on signal flow vectors at a register level and not at a logic gate level and in which the scan selection technique is also based on the RTL signal flow vector, comprising:

identifying sequential elements that form a register or signals which are outputs of sequential elements that form a register, the sequential elements or signals of sequential elements being associated with bits of the register;

selecting if the register is to have a scan property or a non-scan property;

designating the complete register for scan selection if the register is selected to have the scan property, so that bits of the register are not individually selected for scan;

excluding each sequential element or signal of a sequential element from scan selection if the register is selected to have the non-scan property;

providing scan-for-test circuitry to the elements of the register if the register is designated for scan selection; and testing the integrated circuit by performing a scan on the register having the scan-for-test circuitry.

12. The method of claim 11 further comprising selecting multiple registers; grouping the registers to have the same scan or non-scan property as a group; and performing the scan on those registers having the scan-for-test circuitry.

13. The method of claim 11 further comprising identifying like registers in identical instantiated modules; selecting the like registers of the identical instantiated modules to have the same scan or non-scan property; and performing the scan on those registers having the scan-for-test circuitry.

14. The method of claim 11 further comprising identifying registers which couple information to memory or from memory; selecting either those registers which couple information to memory or those registers which couple information from memory to have the same scan or non-scan property; and performing the scan on those registers having the scan-for-test circuitry.

15. The method of claim 11 further comprising identifying registers which couple information to memory or from memory; selecting both those registers which couple information to memory and those registers which couple information from memory to have the same scan or non-scan property; and performing the scan on those registers having the scan-for-test circuitry.

16. An integrated circuit comprising:

sequential circuit elements that form a register or generate signals which are regarded as bits of a register, wherein all of the sequential elements of the register are selected to have a scan property, so that none of the bits of the register are individually selected for scan; and test circuitry coupled only to said sequential circuit elements that form the register which is selected to have the scan property, wherein said test circuitry, when activated in a test mode, allows a scan on all of the bits of the register.

17. The integrated circuit of claim 16 wherein said sequential circuit elements comprise multiple registers and the multiple registers are grouped to have the same scan property as a group.

18. The integrated circuit of claim 16 wherein said sequential circuit elements comprise a register in an instantiated module and wherein all like registers of the instantiated module have the same scan property.

19. The integrated circuit of claim 16 wherein said sequential circuit elements comprise registers which couple information to memory or from memory and wherein either those registers which couple information to memory or those registers which couple information from memory have the scan property.

20. The integrated circuit of claim 16 wherein said sequential circuit elements comprise registers which couple information to memory or from memory and wherein both those registers which couple information to memory and those registers which couple information from memory have the scan property.

* * * * *